US006968515B2

(12) United States Patent
Hashimoto

(10) Patent No.: US 6,968,515 B2
(45) Date of Patent: Nov. 22, 2005

(54) SEMICONDUCTOR CIRCUIT DESIGNING APPARATUS AND A SEMICONDUCTOR CIRCUIT DESIGNING METHOD IN WHICH THE NUMBER OF STEPS IN A CIRCUIT DESIGN AND A LAYOUT DESIGN IS REDUCED

(75) Inventor: Eiki Hashimoto, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 253 days.

(21) Appl. No.: 10/015,209

(22) Filed: Nov. 16, 2001

(65) Prior Publication Data

US 2002/0062474 A1    May 23, 2002

(30) Foreign Application Priority Data

Nov. 21, 2000  (JP) .............................. 2000-354306

(51) Int. Cl.⁷ .............................................. G06F 17/50
(52) U.S. Cl. ...................... 716/1; 716/4; 716/5; 716/18
(58) Field of Search ...................... 716/2, 1, 19; 707/1; 700/121

(56) References Cited

U.S. PATENT DOCUMENTS

| | | | | |
|---|---|---|---|---|
| 5,220,512 A | * | 6/1993 | Watkins et al. ................ | 716/11 |
| 5,418,728 A | * | 5/1995 | Yada ............................ | 700/97 |
| 5,526,517 A | * | 6/1996 | Jones et al. ..................... | 707/8 |
| 5,553,002 A | * | 9/1996 | Dangelo et al. ............... | 716/11 |
| 5,572,430 A | * | 11/1996 | Akasaka et al. .............. | 700/95 |
| 5,802,075 A | * | 9/1998 | Carpenter et al. ........... | 714/738 |
| 5,933,350 A | * | 8/1999 | Fujimoto et al. ............ | 700/121 |
| 6,055,463 A | * | 4/2000 | Cheong et al. ............. | 700/223 |
| 6,289,254 B1 | * | 9/2001 | Shimizu et al. ............... | 700/96 |
| 6,482,557 B1 | * | 11/2002 | Chen et al. .................... | 430/30 |
| 6,539,106 B1 | * | 3/2003 | Gallarda et al. ............ | 382/149 |
| 6,578,174 B2 | * | 6/2003 | Zizzo ............................ | 716/1 |
| 6,578,175 B1 | * | 6/2003 | Benevit et al. ................. | 716/2 |
| 6,634,008 B1 | * | 10/2003 | Dole ............................. | 716/1 |
| 2001/0044667 A1 | * | 11/2001 | Nakano et al. ............. | 700/100 |
| 2002/0046386 A1 | * | 4/2002 | Skoll et al. .................... | 716/1 |
| 2002/0156757 A1 | * | 10/2002 | Brown .......................... | 707/1 |

FOREIGN PATENT DOCUMENTS

| | | |
|---|---|---|
| JP | 6-162127 | 6/1994 |
| JP | 10-079435 | 3/1998 |
| JP | 10-198708 | 7/1998 |

* cited by examiner

Primary Examiner—A. M. Thompson
(74) Attorney, Agent, or Firm—Katten Muchin Rosenman LLP

(57) ABSTRACT

A semiconductor circuit designing apparatus includes a circuit design unit executing and an inspection item database section. The circuit design unit executes a logical design of a semiconductor integrated circuit. In the inspection item database section a circuit feature of the semiconductor integrated circuit corresponds to an inspection item of an inspection to be executed before a layout design of the semiconductor integrated circuit is executed. The circuit design unit generates target circuit feature information indicating the circuit feature of a target semiconductor integrated circuit of the semiconductor integrated circuit of which the logical design should be executed. The circuit design unit obtains a target inspection item of the inspection item corresponding to the target circuit feature information from the inspection item database section. The circuit design unit executes the logical design of the target semiconductor integrated circuit in reference to the target inspection item.

10 Claims, 14 Drawing Sheets

Fig. 2

4: CHECK SHEET

| CIRCUIT FEATURE | | | | | | | INSPECTION ITEM AND RESULT | | | |
|---|---|---|---|---|---|---|---|---|---|---|
| TECHNOLOGY | CONDITION | MODEL NAME | PACKAGE | THE NUMBER OF PINS | SCAN | BOUNDARY SCAN | RAM | NET LIST CHECK | PATTERN CHECK | SCAN CHECK | TIMING CHECK |
| CMOS9HD | cmos_3.3V | 65956E00 | TBG | 420 | USED | NOT-USED | NOT-USED | ERROR 0 | ERROR 2 | NOT-EXECUTED | ERROR 0 |

Fig. 3

6: INSPECTION ITEM DATABASE

| CIRCUIT FEATURE | INSPECTION ITEM | | | | | | |
|---|---|---|---|---|---|---|---|
| | NET LIST CHECK | PATTERN CHECK | SCAN CHECK | BOUNDARY SCAN CHECK | TIMING CHECK | TEST TERMINAL CHECK | RAM CHECK |
| BASIC CONFIGURATION | EXECUTED | EXECUTED | | | EXECUTED | | |
| USAGE OF THE SCAN | EXECUTED | EXECUTED | EXECUTED | | EXECUTED | | |
| USAGE OF THE BOUNDARY SCAN | EXECUTED | EXECUTED | | EXECUTED | EXECUTED | | |
| USAGE OF THE RAM | EXECUTED | EXECUTED | | | EXECUTED | | EXECUTED |
| TEST BUS CONFIGURATION | EXECUTED | EXECUTED | | | EXECUTED | EXECUTED | |
| ⋮ | ⋮ | ⋮ | ⋮ | ⋮ | ⋮ | ⋮ | ⋮ |

Fig. 4

7: MODEL DEVELOPMENT HISTORY DATABASE

| ID INFORMATION | CIRCUIT FEATURE | | | | INSPECTION ITEM EXECUTION HISTORY | | | | | | | |
|---|---|---|---|---|---|---|---|---|---|---|---|---|
| | TECHNOLOGY | CONDITION | MODEL NAME | PACKAGE | PHASE | DATA | NET LIST CHECK | PATTERN CHECK | SCAN CHECK | BOUNDARY SCANCHECK | TIMING CHECK | ... |
| AAA | CMOS9HD | cmos_3.3V | 6595 6E00 | TBG | ACCEPTED | 9/11 | ERROR 0 | ERROR 2 | NOT-EXECUTED | NOT-TARGETED | ERROR 0 | ... |
| | | | | | RE-ACCEPTED | 9/14 | ERROR 0 | ERROR 0 | ERROR 0 | NOT-TARGETED | ERROR 0 | ... |
| | | | | | BACK ANNOTATION | 9/18 | ERROR 0 | ERROR 0 | ERROR 0 | NOT-TARGETED | ERROR 0 | ... |
| | CB7 | ttl_5V | 87543 | QOGN | ACCEPTED | 9/4 | EXCEPTED | ERROR 0 | NOT-TARGETED | ERROR 0 | ERROR 0 | ... |
| | | | | | BACK ANNOTATION | 9/11 | ERROR 0 | ERROR 0 | NOT-TARGETED | ERROR 0 | ERROR 0 | ... |
| ABC | CB8 | ttl_3.3V | 12345 | A8SI | ACCEPTED | 8/3 | ERROR 0 | ERROR 0 | ERROR 0 | NOT-TARGETED | ERROR 0 | ... |
| | | | | | BACK ANNOTATION | 8/7 | ERROR 0 | ERROR 0 | ERROR 0 | NOT-TARGETED | ERROR 0 | ... |
| | CMOS6 | cmos_5V | 6562 4E99 | QFP | ACCEPTED | 7/29 | ERROR 0 | ERROR 0 | NOT-TARGETED | NOT-TARGETED | ERROR 0 | ... |
| | | | | | BACK ANNOTATION | 9/4 | ERROR 0 | ERROR 0 | NOT-TARGETED | NOT-TARGETED | ERROR 0 | ... |
| | ... | ... | ... | ... | ... | ... | ... | ... | ... | ... | ... | ... |

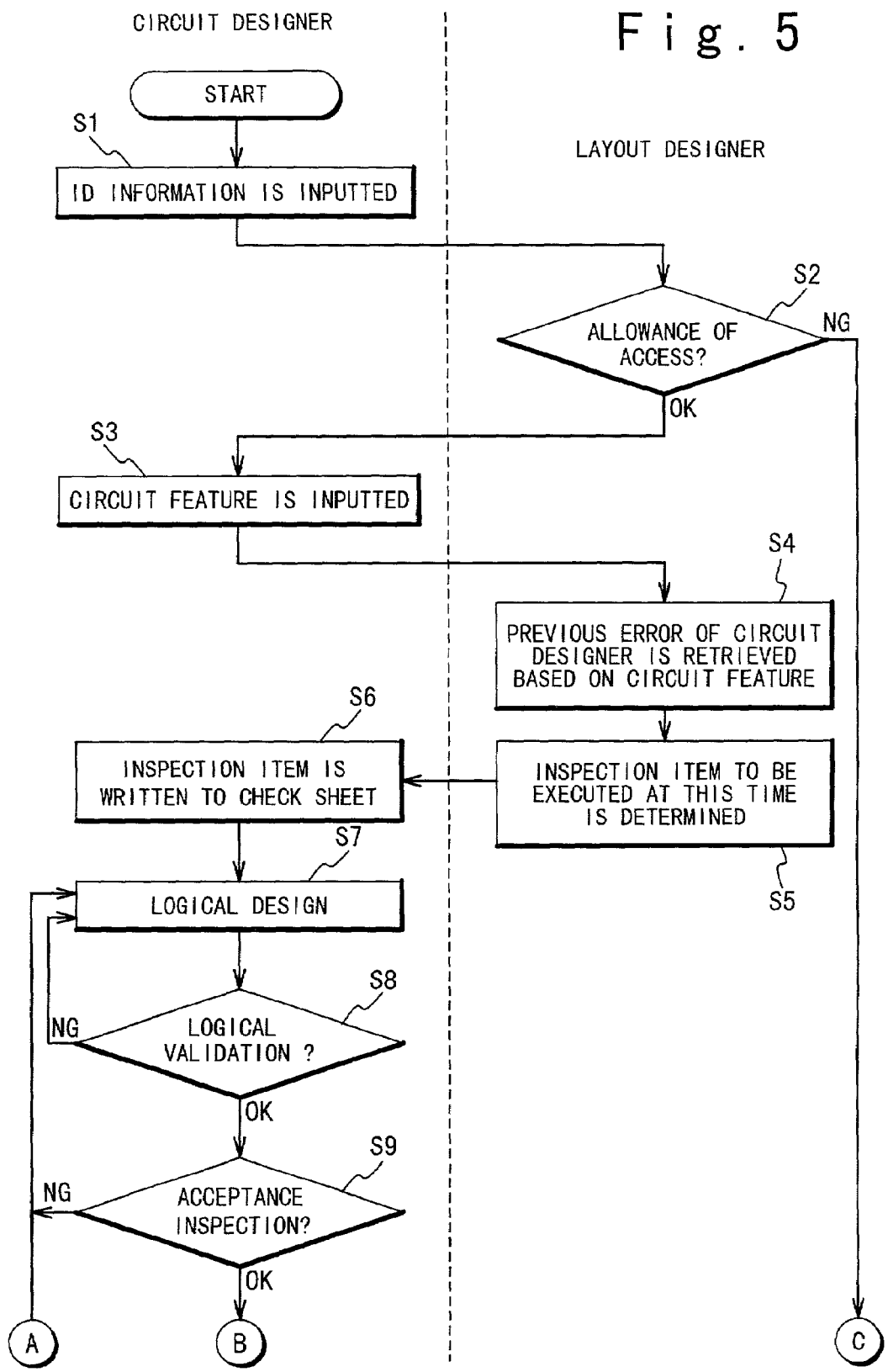

SEMICONDUCTOR CIRCUIT DESIGNING APPARATUS AND A SEMICONDUCTOR CIRCUIT DESIGNING METHOD IN WHICH THE NUMBER OF STEPS IN A CIRCUIT DESIGN AND A LAYOUT DESIGN IS REDUCED

BACKGROUND OF THE INVENTION

1. Field of the Invention

The present invention relates to a semiconductor circuit designing apparatus and a semiconductor circuit designing method. More particularly, the present invention relates to a semiconductor circuit designing apparatus and a semiconductor circuit designing method, which are used in a silicon interface field of an ASIC development so as to further reduce the number of steps in a circuit design and a layout design.

2. Description of the Related Art

In a field of a semiconductor design, a division between a circuit design and a layout design is advanced as a circuit becomes large and complex, and the respective automations are advanced. In such division, an acceptance inspection is executed for examining whether or not a circuit information interfaced so as to minimize a backward motion of a step is reasonable. Inspection items for such an acceptance inspection are different depending on a circuit feature, such as a circuit configuration, a test simplifying method to be used and the like. So, the items of the acceptance inspection to be executed are determined depending on the circuit feature.

A layout designer carries out all necessary acceptance inspections for each model, on the basis of the circuit information prepared by the circuit designer. So, a number of steps are needed in order to execute the acceptance inspection and confirm the result. Or, there may be a case that an acceptance inspection on the layout designer side is omitted by inquiring the executed inspection items of the circuit designer. However, an answer (entry) miss on the circuit designer side, a misunderstanding or the like causes an erroneous result to be reported, which results in the backward motion of the step (iteration) in many cases.

A known drawing validation system disclosed in Japanese Laid Open Patent Application (JP-A-Heisei, 10-198708) includes a first memory for storing a data indicative of a drawing, a second memory for storing a data indicative of a predetermined condition and a judging unit for judging whether or not the drawing agrees with the predetermined condition. Such a drawing validation system can automatically validate whether or not an item specified on the basis of a know-how and an experience of the circuit designer is accurately reflected to thereby prepare a drawing of a layout of a printed circuit board, without any manual work. Thus, it is possible to prepare the drawing with high quality in a short time.

This drawing validation system relates to a determination of an inspection item and an inspection execution in a single drawing validation system to be used by the layout designer. Its applicable department is limited to the layout designer side. Thus, it does not disclose a method to be used for the circuit designer to avoid a problem.

Japanese Laid Open Patent Application (JP-A-Heisei, 10-79435) discloses the following semiconductor development information integrating apparatus. In a semiconductor information managing apparatus, the electronic data based on a photo-mask specification prepared in a semiconductor design and the electronic data in respective manufacturing processes prepared in a semiconductor manufacturing process are stored and managed in a same data or a plurality of databases as an integrated semiconductor information. Thus, the information with regard to a CAD apparatus, a semiconductor manufacturing electronic terminal and a semiconductor manufacturing apparatus are shared.

SUMMARY OF THE INVENTION

The present invention is accomplished in view of the above mentioned problems. Therefore, an object of the present invention is to provide a semiconductor circuit designing apparatus and a semiconductor circuit designing method, in which an iteration, such as a re-design and the like, caused by a design trouble can be reduced.

Another object of the present invention is to provide a semiconductor circuit designing apparatus and a semiconductor circuit designing method, in which inspection items can be reduced.

Still another object of the present invention is to provide a semiconductor circuit designing apparatus and a semiconductor circuit designing method, in which a burden of a number of steps on a circuit designer can be reduced.

Still another object of the present invention is to provide a semiconductor circuit designing apparatus and a semiconductor circuit designing method, in which a burden of a number of steps on a layout designer can be reduced.

In order to achieve an aspect of the present invention, a semiconductor circuit designing apparatus, includes: a circuit design unit executing a logical design of a semiconductor integrated circuit; and an inspection item database section in which a circuit feature of the semiconductor integrated circuit corresponds to an inspection item of a inspection to be executed before a layout design of the semiconductor integrated circuit is executed, and wherein the circuit design unit generates a target circuit feature information indicating the circuit feature of a target semiconductor integrated circuit of the semiconductor integrated circuit of which the logical design should be executed, and wherein the circuit design unit obtains a target inspection item of the inspection item corresponding to the target circuit feature information from the inspection item database section, and wherein the circuit design unit executes the logical design of the target semiconductor integrated circuit in reference to the target inspection item.

In this case, the semiconductor circuit designing apparatus further includes: a model development history database section in which an ID data of the circuit design unit corresponds to the number of times the circuit design unit failed the inspection of the inspection item previously, and wherein the target inspection item is determined such that the inspection item of which the number of times is smaller than a predetermined value is withdrawn from the target inspection item.

Also in this case, the semiconductor circuit designing apparatus further includes: a layout design unit executing the layout design, and wherein the circuit design unit executes the inspection of the target semiconductor integrated circuit of which the layout design is executed, with regard to the target inspection item, and wherein the circuit design unit provides a result of the inspection with the target semiconductor integrated circuit to the layout design unit.

Further in this case, the semiconductor circuit designing apparatus further includes: a layout design unit executing the layout design, and wherein the circuit design unit executes the inspection of the target semiconductor integrated circuit of which the layout design is executed, with regard to the target inspection item, and wherein the circuit design unit provides a result of the inspection with the target semiconductor integrated circuit to the layout design unit.

In this case, when the provided result of the inspection has no problem, the layout design unit stores the ID data of the circuit design unit and the number of times the circuit design unit failed the inspection of the target inspection item in the model development history database section.

Also in this case, the inspection item database section belongs to the circuit design unit.

Further in this case, the inspection item database section belongs to the circuit design unit.

In this case, the inspection item database section belongs to the layout design unit.

Also in this case, the inspection item database section belongs to the layout design unit.

Further in this case, the inspection item database section belongs to the layout design unit.

In this case, the layout design unit includes a plurality of layout design sections, and wherein the inspection item database section belongs to at least one of the plurality of layout design sections.

Also in this case, the semiconductor circuit designing apparatus further includes: a data center provided to be different from the circuit design unit and the layout design unit, and wherein the inspection item database section belongs to the data center.

In order to achieve another aspect of the present invention, a semiconductor circuit designing method, includes: (a) providing a inspection item database section in which a circuit feature of a semiconductor integrated circuit in which a logical design should be executed corresponds to an inspection item of a inspection to be executed before a layout design of the semiconductor integrated circuit is executed; (b) notifying a circuit designer executing the logical design of the semiconductor integrated circuit of the inspection item corresponding to the semiconductor integrated circuit retrieved from the inspection item database section; and (c) executing the logical design of the semiconductor integrated circuit by the circuit designer in reference to the notified inspection item.

In this case, the semiconductor circuit designing method, further includes: (d) providing the semiconductor integrated circuit in which the notified inspection item is passed to a layout designer executing the layout design.

In order to achieve still another aspect of the present invention, the semiconductor circuit designing method, includes: (e) providing a circuit design unit executing a logical design of a semiconductor integrated circuit; and (f) providing an inspection item database section in which a circuit feature of the semiconductor integrated circuit corresponds to an inspection item of a inspection to be executed before a layout design of the semiconductor integrated circuit is executed, and wherein the circuit design unit generates a target circuit feature information indicating the circuit feature of a target semiconductor integrated circuit of the semiconductor integrated circuit of which the logical design should be executed, and wherein the circuit design unit obtains a target inspection item of the inspection item corresponding to the target circuit feature information from the inspection item database section, and wherein the circuit design unit executes the logical design of the target semiconductor integrated circuit in reference to the target inspection item.

In this case, the semiconductor circuit designing method further includes: (g) providing a model development history database section in which an ID data of the circuit design unit corresponds to the number of times the circuit design unit failed the inspection of the inspection item previously, and wherein the target inspection item is determined such that the inspection item of which the number of times is smaller than a predetermined value is withdrawn from the target inspection item.

Also in this case, the semiconductor circuit designing method further includes: (h) providing a layout design unit executing the layout design, and wherein the circuit design unit executes the inspection of the target semiconductor integrated circuit of which the layout design is executed, with regard to the target inspection item, and wherein the circuit design unit provides a result of the inspection with the target semiconductor integrated circuit to the layout design unit.

Further in this case, the semiconductor circuit designing method further includes: (i) providing a layout design unit executing the layout design, and wherein the circuit design unit executes the inspection of the target semiconductor integrated circuit of which the layout design is executed, with regard to the target inspection item, and wherein the circuit design unit provides a result of the inspection with the target semiconductor integrated circuit to the layout design unit.

In this case, when the provided result of the inspection has no problem, the layout design unit stores the ID data of the circuit design unit and the number of times the circuit design unit failed the inspection of the target inspection item in the model development history database section.

Also in this case, the inspection item database section belongs to the circuit design unit.

BRIEF DESCRIPTION OF THE DRAWINGS

FIG. 2 is a table of a check sheet of a semiconductor design system according to a embodiment of the present invention;

FIG. 3 is a table of a inspection item database of a semiconductor design system according to a embodiment of the present invention;

FIG. 4 is a table of a model development history database of a semiconductor design system according to a embodiment of the present invention;

FIG. 5 is a flow chart of semiconductor design method according to a embodiment of the present invention;

DESCRIPTION OF THE PREFERRED EMBODIMENTS

Figure 1:
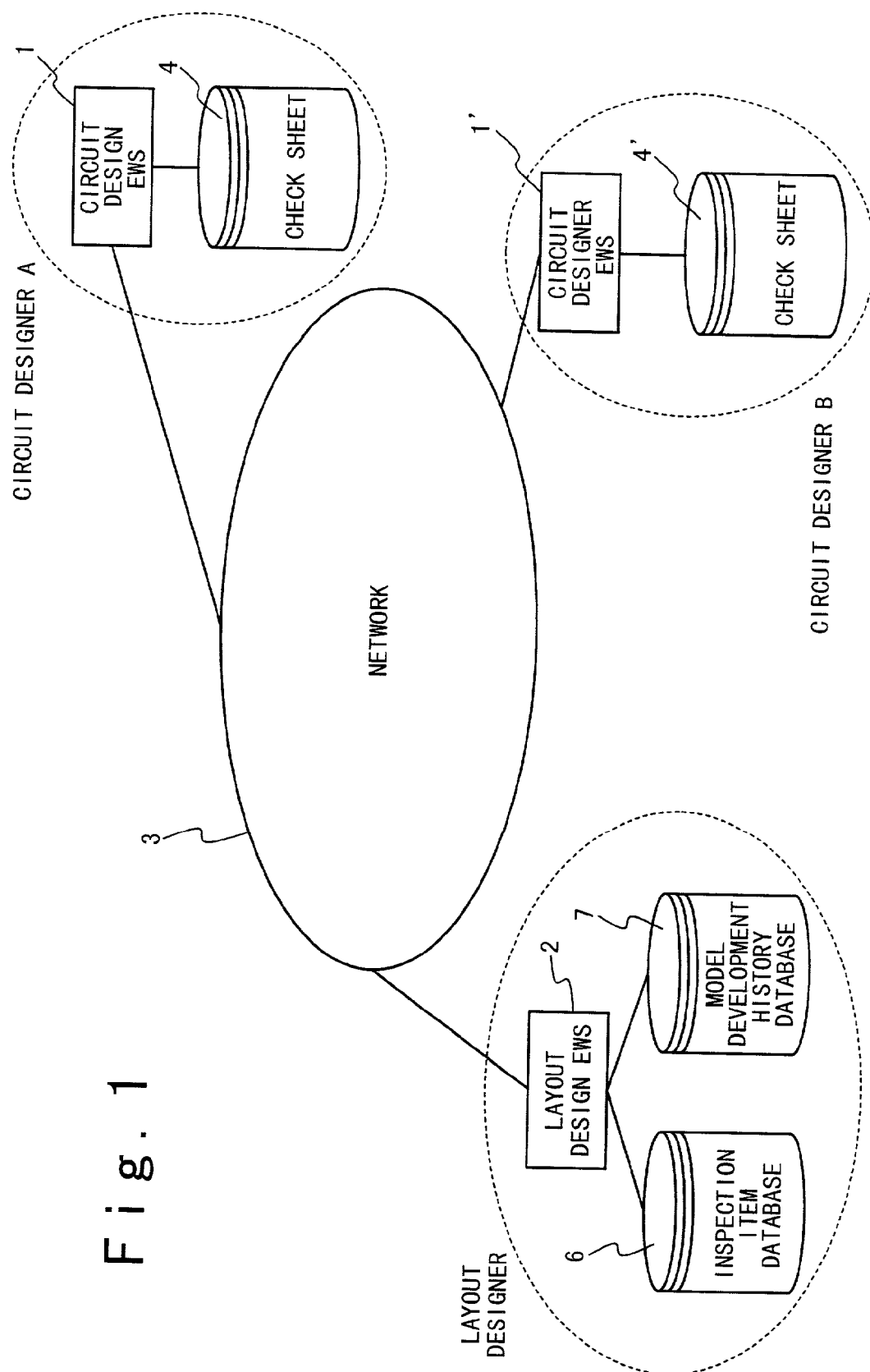
FIG. 1 is a block diagram showing a configuration of a semiconductor design system according to a embodiment of the present invention.

With reference to the attached drawings, an embodiment of a semiconductor designing system according to the present invention, a plurality of engineering workstations (hereafter, abbreviated as [EWS]) are connected to each other. The plurality of EWS are provided with a circuit design EWS1 and a layout design EWS2. They are connected to each other through a network 3.

The circuit design EWS1 is installed for each circuit designer and used for a circuit design. For example, the circuit design EWS1 belongs to a circuit designer A, and a circuit design EWS1' belongs to a circuit designer B. Circuit designers ID different from each other are assigned to the circuit designers. The circuit designer ID is used to identify the circuit designer and identify a right under which the circuit designer accesses the layout design EWS2. The circuit designer is one person or a plurality of persons attached to one group. That group is an enterprise, a department within an enterprise, a design group within a department or the like. The circuit design EWS1 has a check sheet 4. The check sheet 4 is an interface file in which a circuit feature of a semiconductor integrated circuit, an inspection item and an inspection result are noted. The check sheet 4 is prepared for each circuit design.

The layout design EWS2 belongs to a layout designer, and it is used for the layout design. The layout designer gives the circuit designer ID to each circuit designer. The layout design EWS2 has an inspection item database 6 and a model development history database 7. The inspection item database 6 is noted while a circuit feature and an inspection item necessary for the circuit feature are correlated to each other. The model development history database 7 is noted while a circuit designer ID of a designing circuit designer, a circuit feature of a previously designed semiconductor integrated circuit and a frequency of errors occurring in the development step are correlated to each other.

FIG. 2 shows an actual example of the check sheet 4. The circuit feature, the inspection item and an inspection result are noted in the check sheet 4. A technology, a condition, a model name, a package, a number of pins, a presence or absence of a usage of a test simplifying method are noted as the circuit feature. The test simplifying method uses a scan, a boundary scan and RAM. A net list check, a pattern check, a scan check, a timing check and the like are noted as the inspection items.

In the semiconductor integrated circuit according to this embodiment on which the acceptance inspection is performed, the technology is CMOS9HD, the condition is 3.3 V, the model name is 65956E00, the package is TBG, and the number of pins is 420 pins. Moreover, the scan manner of the test simplifying method is used without using the boundary scan and the RAM. The inspection items necessary for this semiconductor integrated circuit are the net list check, the pattern check, the scan check and the timing check. As the inspection result, there is no error in the net list check, there are two errors in the pattern check, the scan check is not executed, and there is no error in the timing check.

FIG. 3 shows an actual example of the inspection item database 6. As for the semiconductor integrated circuit, the inspection items are different depending on the circuit feature. The inspection items necessary for the respective circuit features of the semiconductor integrated circuit are noted in the inspection item database 6. As the circuit feature, there are a basic configuration, a usage of the scan, a usage of the boundary scan, a usage of the RAM, a test bus configuration and the like. As the inspection items, there are the net list check, the pattern check, the scan check, the boundary scan check, the timing check, a test terminal check and a RAM check.

If the semiconductor integrated circuit on which the acceptance inspection is performed is designed by only the basic configuration, the inspection items in the acceptance inspection that must be executed are the net list check, the pattern check and the timing check. If the semiconductor integrated circuit on which the acceptance inspection is performed employs the scan manner that is the test simplifying method, the inspection items in the acceptance inspection that must be executed are the net list check, the pattern check, the scan check and the timing check.

If the semiconductor integrated circuit on which the acceptance inspection is performed employs the boundary scan manner that is the test simplifying method, the inspection items in the acceptance inspection that must be executed are the net list check, the pattern check, the boundary scan check and the timing check. If the semiconductor integrated circuit on which the acceptance inspection is performed employs the RAM, they are the net list check, the pattern check, the timing check and the RAM check. If the semiconductor integrated circuit on which the acceptance inspection is performed has the test bus configuration, the inspection items in the acceptance inspection that must be executed are the net list check, the pattern check, the timing check and the test terminal check.

Such an inspection item database 6 clarifies the inspection items in the acceptance inspection to be executed. This results in the sure execution of the acceptance inspection.

FIG. 4 shows an actual example of the model development history database 7. In the model development history database 7, the designer ID, the circuit feature and the inspection result are noted while they are correlated to each other, for each semiconductor integrated circuit.

For example, in a case of a semiconductor integrated circuit having a model name of 6595E00 it is designed by a circuit designer whose circuit designer ID is AAA, its design technology is CMOS9HD, a proprietary design rule for CMOS (complementary metal-oxide semiconductor), the source of its design is CMOS 3.3V, one of the libraries regarding CMOS9HD in a computer-aided design (CAD) system for designing a semiconductor circuit, and its package is TBG. As the various inspection results of this semiconductor integrated circuit, there is no error in the net list check, there are two errors in the pattern check, the scan check is not executed, and there is no error in the timing check, in the acceptance inspection executed on September 11.

In a re-acceptance inspection executed on September 14, there is no error in the net list check, there is no error in the pattern check, the scan check is not executed, and there is no timing check. In a back annotation executed on September 18, there is no error in the net list check, there are two errors in the pattern check, there is no error in the scan check, and there is no error in the timing check.

Figure 6:
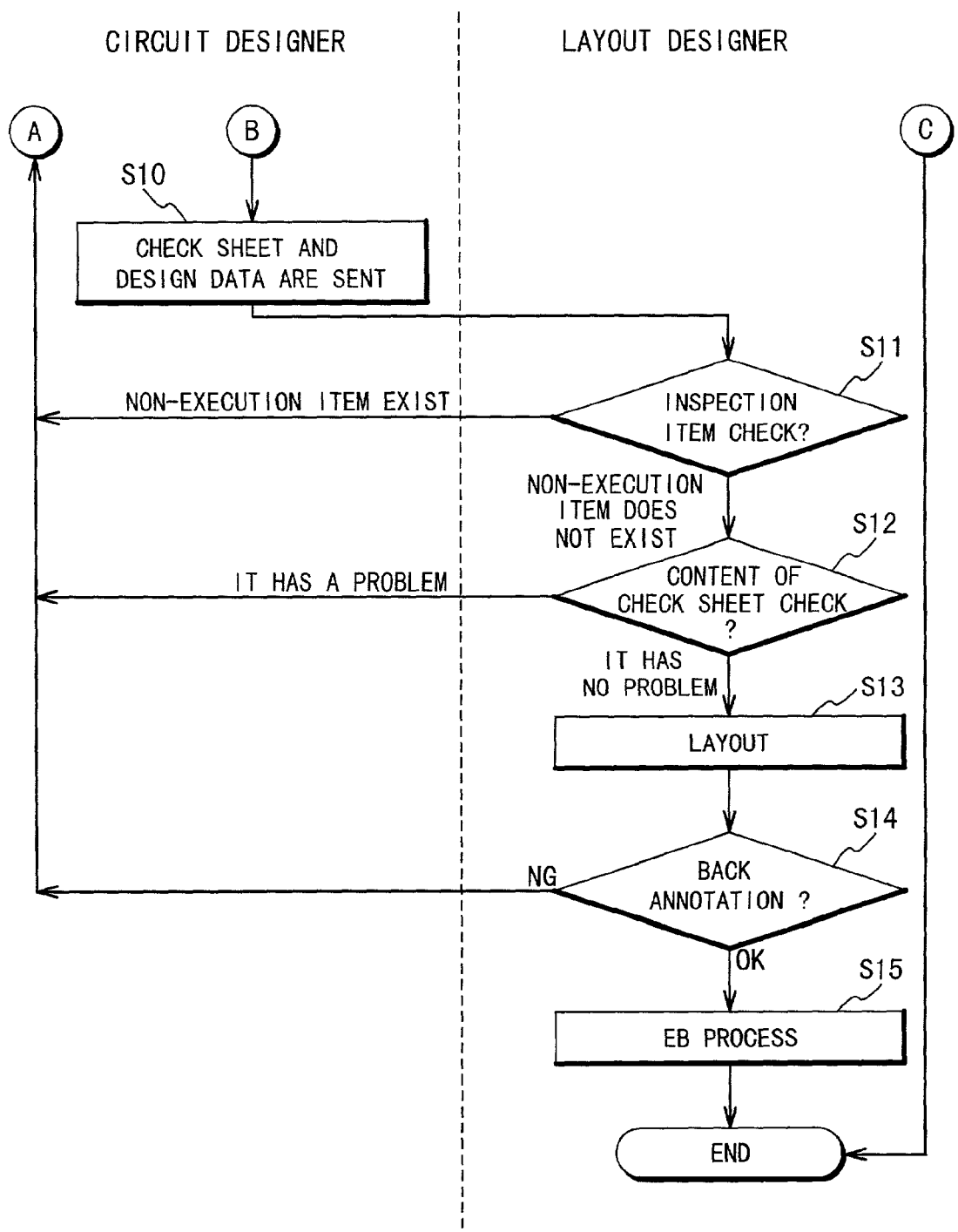
FIG. 6 is a flow chart of semiconductor design method according to a embodiment of the present invention.

FIGS. 5, 6 show the operation of the semiconductor designing system according to the present invention. At first, a circuit designer inputs a circuit designer ID to the circuit design EWS1 (Step S1). The circuit design EWS1 sends the input circuit designer ID through the network 3 to the layout design EWS2.

The layout design EWS2 judges an allowance or rejection of an access in accordance with the circuit designer ID (Step S2). If it is judged that there is no problem in the circuit designer ID, the access is allowed, and the layout design EWS2 reports its fact to the circuit design EWS1. If the access is allowed, the circuit designer inputs to the circuit design EWS1 the circuit feature of a semiconductor integrated circuit to be designed. The circuit design EWS1 sends the circuit feature to the layout design EWS2 (Step S3).

The layout design EWS2 obtains the circuit designer ID and the circuit feature, retrieves an inspection item to be inspected on the basis of the inspection item database 6, and retrieves a previous error of the circuit designer designing the semiconductor integrated circuit on the basis of the model development history database 7 (Step S4). The layout design EWS2 determines an inspection item to be executed at this time on the basis of the retrieved inspection item and error (Step S5).

For example, if there is an inspection item having no problem in five models finally developed by the circuit designer, an execution of the inspection item is exempted. If there is an item in which an error is recorded in the model development history database, the item is determined to be an inspection item to be executed. Such exemption enables the number of inspection items to be reduced on the basis of the experience and the level of the circuit designer. Thus, the burden on the circuit designer is relaxed. If the circuit designer is composed of a plurality of designers, the exempted inspection items are greater to further relax the burden on the circuit designer.

The layout design EWS2 sends the determined execution inspection item to the circuit design EWS1. The circuit design EWS1 receives the execution inspection item from the layout design EWS2, and writes the inspection items and the circuit feature of the semiconductor integrated circuit to the check sheet 4 (Step S6). The circuit design EWS1 displays a previous error content received from the layout design EWS2 on a screen. The circuit designer designs a logical circuit while paying attention to the previous error content and the execution inspection item (Step S7). Since the item to which the attention must be paid can be obtained at an initial stage of a logical design, the circuit designer can avoid a logical design unsuitable for a layout design and accordingly avoid the re-design (iteration).

If the design of the logical circuit is completed, a logical validation of the logical design is executed (Step S8). If any trouble is discovered in the logical validation, the logical design is again carried out. After the completion of the logical design, the circuit design EWS1 checks the acceptance inspection item noted in the check sheet 4 (Step S9). The inspection result is additionally written to the check sheet 4. If there is a rejected item among the inspection items noted in the check sheet 4, the logical design is again carried out. Such re-design can prevent an unnecessary iteration in advance. If there is no problem in all the items among the acceptance inspection items, the circuit design EWS1 sends the check sheet 4 together with the design data such as a circuit connection information, a pattern and the like to the layout design EWS2 (Step S10).

The layout design EWS2 compares the execution inspection items noted in the check sheet 4 with the executed result, in response to the reception of the check sheet 4. If there is an inspection item in which the executed result is not noted in the inspection items to be executed, it is judged as a non-execution, and it is returned back to the circuit designer, and the inspection of the non-execution item is requested (Step S11). If there is a result unsuitable for the layout as the result of the acceptance inspection, it is returned back to the circuit designer, and the improvement based on the re-design is requested (Step S12). If the layout has no problem in all the inspection items, the inspection result together with the circuit feature and the circuit designer ID is written to the model development history database 7.

After that, the layout designer designs the layout (Step S13). After the design of the layout, a back annotation is carried out (Step S14). In the back annotation, it is confirmed whether or not the semiconductor integrated circuit carries out a desirably functional operation at a delay after the layout, and additionally writes its result to the model development history database 7. If the result of the back annotation is NG, it is returned back to the circuit designer, and the improvement based on the re-design is requested. If the result of the back annotation is OK, an Electron Beam data conversion process (EB process) is carried out (Step 15).

By the way, the back annotation may be executed by the circuit designer. At this time, after the design of the layout, the layout design data is sent from the layout design EWS2 to the circuit design EWS1, and the circuit design EWS1 executes the back annotation. If the back annotation is NG, the logical design is again carried out. If the back annotation is OK, the circuit design EWS1 sends its fact to the layout design EWS2. The layout designer carries out the EB process, in response to the report of the back annotation OK.

Due to the correspondent consideration between the previous error and problem and the circuit feature and the circuit designer, the circuit designer can obtain the items to be considered at the time of the logical design prior to the designing and thereby avoid the problem at the stage of the logical design. Also, since the circuit designer executes the acceptance inspection, the acceptance inspection of the layout designer is not required, which reduces the number of steps in the layout designer. Moreover, it is possible to reduce the request of the re-design to the circuit designer from the layout designer side caused by the defective result of the acceptance inspection. Such dispersion of the process can attain a further reduction in TAT.

Figure 7:
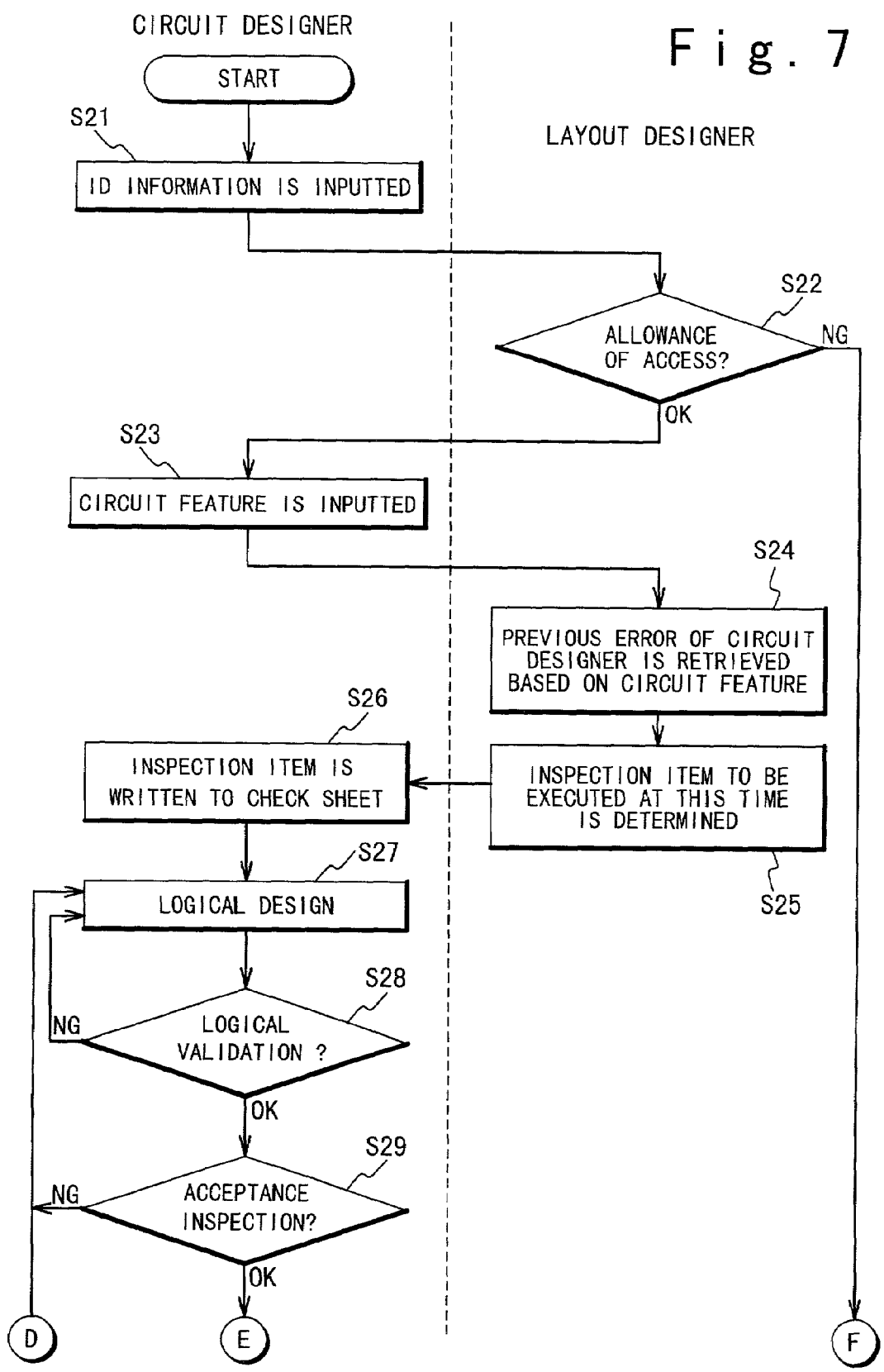
FIG. 7 is a flow chart of semiconductor design method according to another embodiment of the present invention.
Figure 8:
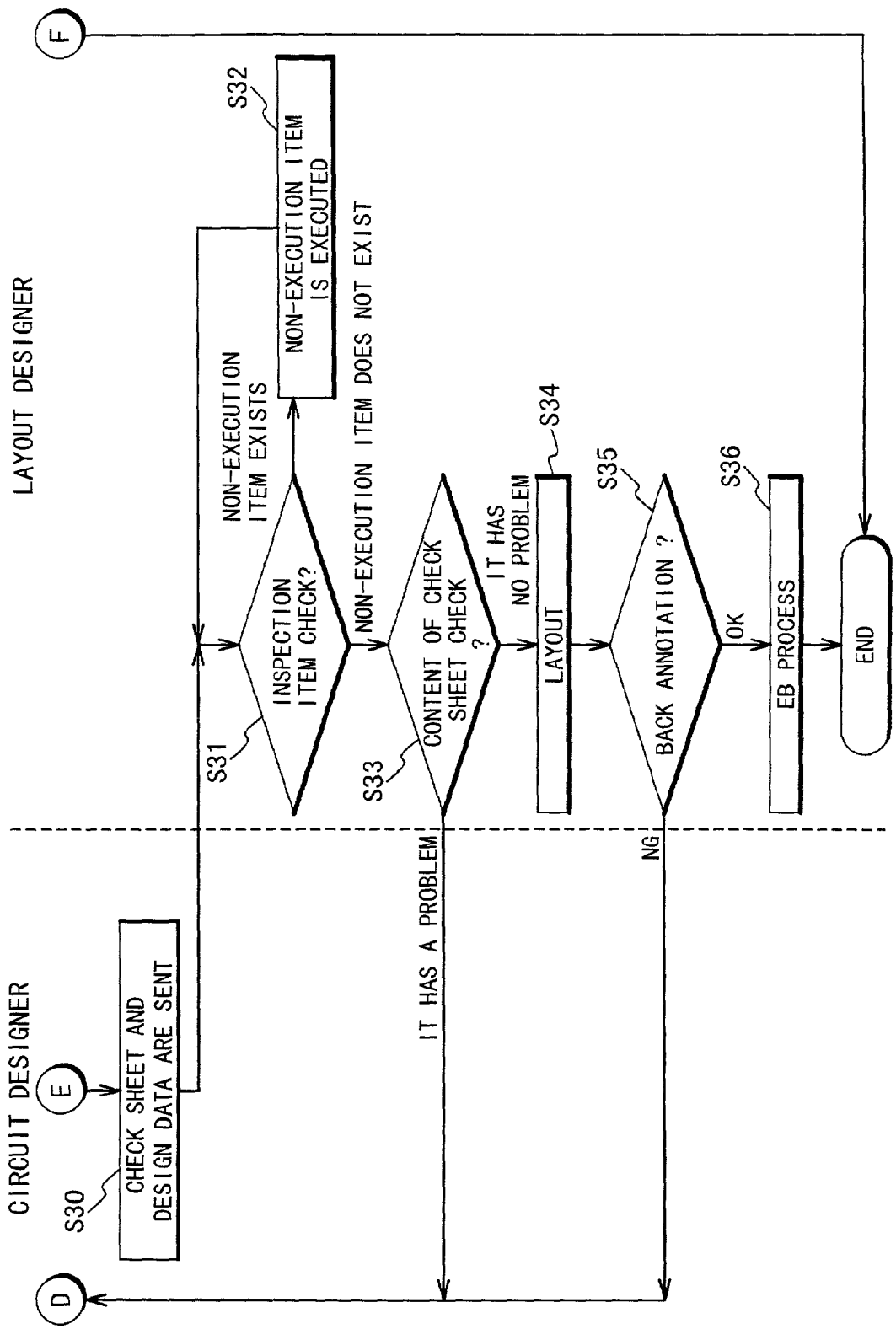
FIG. 8 is a flow chart of semiconductor design method according to another embodiment of the present invention.

FIGS. 7, 8 show another operation of the semiconductor designing system according to the present invention. At first, a circuit designer inputs a circuit designer ID to the circuit design EWS1 (Step S21). The circuit design EWS1 sends the input circuit designer ID through the network 3 to the layout design EWS2.

The layout design EWS2 judges an allowance or rejection of an access in accordance with the circuit designer ID (Step S22). If it is judged that there is no problem in the circuit designer ID, the access is allowed, and the layout EWS2 reports its fact to the circuit design EWS1. If the access is allowed, the circuit designer inputs to the circuit design EWS1 the circuit feature of a semiconductor integrated circuit to be designed (Step S23). The circuit design EWS1 sends the circuit feature to the layout design EWS2.

The layout design EWS2 obtains the circuit designer ID and the circuit feature, and retrieves an inspection item to be inspected on the basis of the inspection item database 6, and then retrieves a previous error of the circuit designer designing the semiconductor integrated circuit on the basis of the model development history database 7 (Step S24). The layout design EWS2 determines an inspection item to be executed at this time on the basis of the retrieved inspection item and error (Step S5). For example, if there is an inspection item having no problem in five models finally developed by the circuit designer, an execution of the inspection item is exempted. If there is an item in which an error is recorded in the model development history database, the item is determined to be an inspection item to be executed. The layout design EWS2 sends the determined inspection item to the circuit design EWS1.

The circuit design EWS1 receives the execution inspection item from the layout design EWS2, and writes the inspection items and the circuit feature of the semiconductor integrated circuit to the check sheet 4 (Step S26). The circuit design EWS1 displays a previous error content received from the layout design EWS2 on the screen. The circuit designer designs a logical circuit while paying attention to the previous error content (Step S27). If the design of the logical circuit is completed, a logical validation of the logical design is executed (Step S28). If any trouble is discovered in the logical validation, the logical design is again carried out.

After the completion of the logical design, the circuit design EWS1 checks the acceptance inspection item noted in the check sheet 4 (Step S29). The inspection result is additionally written to the check sheet 4. If there is a rejected item among the inspection items noted in the check sheet 4, the logical design is again carried out. If there is no problem in all the items among the acceptance inspection items, the circuit design EWS1 sends the check sheet 4 together with the design data such as a circuit connection information, a pattern and the like to the layout design EWS2 (Step S30).

The layout design EWS2 compares the execution inspection items noted in the check sheet 4 with the executed result, in response to the reception of the check sheet 4 (Step S31). If there is an inspection item in which the executed result is not noted in the inspection items to be executed, it is judged as a non-execution, and its inspection item is inspected (Step S32). If there is a result unsuitable for the layout as the result of the acceptance inspection, it is returned back to the circuit designer, and the improvement based on the re-design is requested (Step S33). If the layout has no problem in all the inspection items, the inspection result together with the circuit feature and the circuit designer ID is written to the model development history database 7.

After that, the layout designer designs the layout (Step S34). After the design of the layout, the back annotation is carried out (Step S35). The layout design EWS2 additionally writes the result of the back annotation to the model development history database 7. If the result of the back annotation is NG, it is returned back to the circuit designer, and the improvement based on the re-design is requested. The back annotation may be executed by the circuit designer, similarly to the above-mentioned embodiment. If the result of the back annotation is OK, the EB process is carried out (Step S36).

Since the inspection result of the acceptance inspection executed by the circuit designer is written to the check sheet 4, it is not necessary that the same inspection item is again executed in an acceptance inspection on a layout designer side. Moreover, since the number of steps in the acceptance inspection can be reduced, the circuit designer can be devoted entirely to the logical design.

Figure 9:
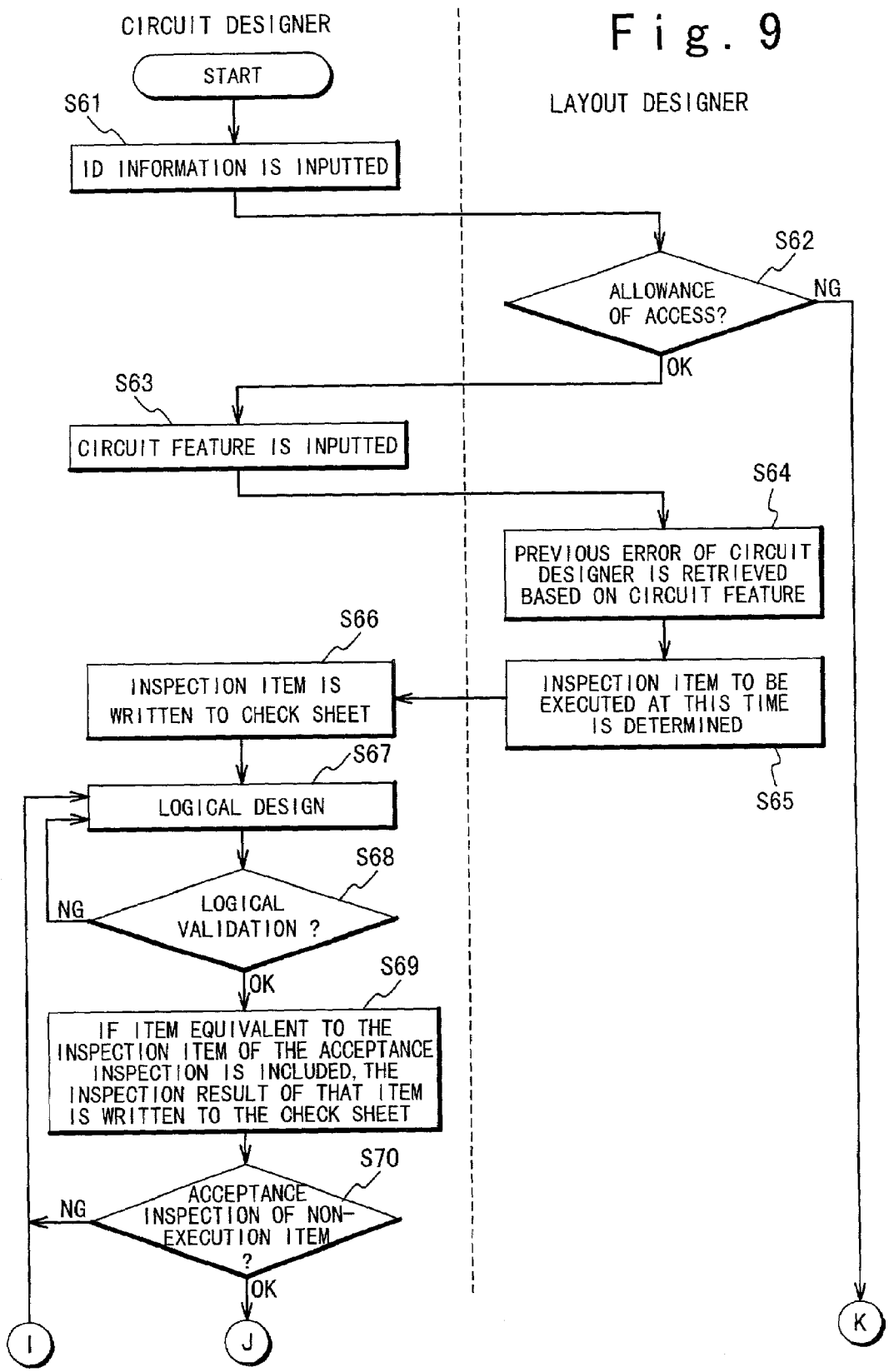
FIG. 9 is a flow chart of semiconductor design method according to still another embodiment of the present invention.
Figure 10:
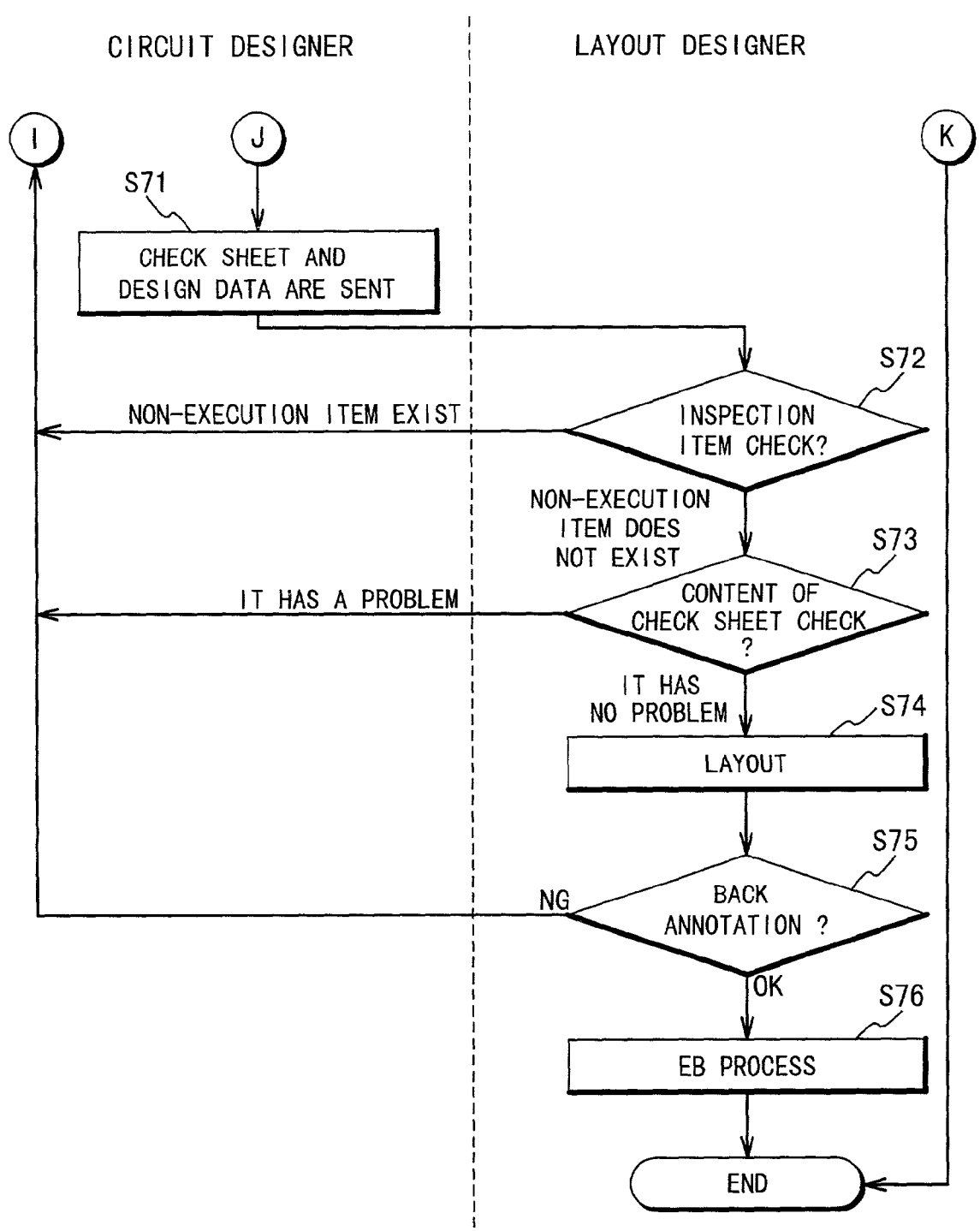
FIG. 10 is a flow chart of semiconductor design method according to still another embodiment of the present invention.

FIGS. 9, 10 show the operation of the semiconductor designing system according to the present invention. At first, a circuit designer inputs a circuit designer ID to the circuit design EWS1 (Step S61). The circuit design EWS1 sends the input circuit designer ID through the network 3 to the layout design EWS2.

The layout design EWS2 judges an allowance or rejection of an access in accordance with the circuit designer ID (Step S62). If it is judged that there is no problem in the circuit designer ID, the access is allowed, and the layout EWS2 reports its fact to the circuit design EWS1. If the access is allowed, the circuit designer inputs to the circuit design EWS1 the circuit feature of a semiconductor integrated circuit to be designed. The circuit design EWS1 sends the circuit feature to the layout design EWS2 (Step S63).

The layout design EWS2 obtains the circuit designer ID and the circuit feature, and retrieves an inspection item to be inspected on the basis of the inspection item database 6, and then retrieves a previous error of the circuit designer designing the semiconductor integrated circuit on the basis of the model development history database 7 (Step S64). The layout design EWS2 determines an inspection item to be executed at this time on the basis of the retrieved inspection item and error (Step S65). For example, if there is an inspection item having no problem in five models finally developed by the circuit designer, an execution of the inspection item is exempted. If there is an item in which an error is recorded in the model development history database, the item is determined to be an inspection item to be executed. The layout design EWS2 sends the determined inspection item to the circuit design EWS1.

The circuit design EWS1 receives the execution inspection item from the layout design EWS2, and writes the inspection items and the circuit feature of the semiconductor integrated circuit to the check sheet 4 (Step S66). The circuit design EWS1 displays a previous error content received from the layout design EWS2 on the screen. The circuit designer designs a logical circuit while paying attention to the previous error content (Step S67). If the design of the logical circuit is completed, a logical validation of the logical design is executed (Step S68). If any trouble is discovered in the logical validation, the logical design is again carried out.

The circuit design EWS1 examines whether or not there is an item equivalent to the inspection item of the acceptance inspection to be executed among the inspection items in the logical validation. If the equivalent item is included, the inspection result of that item is written to the check sheet 4 (Step S69). Such representation can protect the same inspection from being doubly executed, which can reduce the number of steps in the circuit designer. After that, the circuit design EWS1 checks the acceptance inspection items noted in the check sheet 4 (Step S70), and additionally writes the inspection result to the check sheet 4.

If there is a rejected item among the inspection items noted in the check sheet 4, the logical design is again carried out. If there is no problem in all the items among the acceptance inspection items, the circuit design EWS1 sends the check sheet 4 together with the design data such as the circuit connection information, the pattern and the like to the layout design EWS2 (Step S71).

The layout design EWS2 compares the execution inspection items noted in the check sheet 4 with the executed result, in response to the reception of the check sheet 4. If there is an inspection item in which the executed result is not noted in the inspection items to be executed, it is judged as a non-execution, and it is returned back to the circuit designer, and the inspection of the non-execution item is requested (Step S72). If there is a result unsuitable for the layout as the inspection result of the acceptance inspection, it is returned back to the circuit designer, and the improvement based on the re-design is requested (Step S73). If the layout has no problem in all the inspection items, the inspection result together with the circuit feature and the circuit designer ID is written to the model development history database 7.

After that, the layout designer designs the layout (Step S74). After the design of the layout, the back annotation is carried out (Step S75). In the back annotation, it is confirmed whether or not the semiconductor integrated circuit carries out a desirably functional operation at a delay after the layout, and additionally writes its result to the model development history database 7. If the result of the back annotation is NG, it is returned back to the circuit designer, and the improvement based on the re-design is requested. If the result of the back annotation is OK, the EB process is carried out (Step S76).

Figure 11:
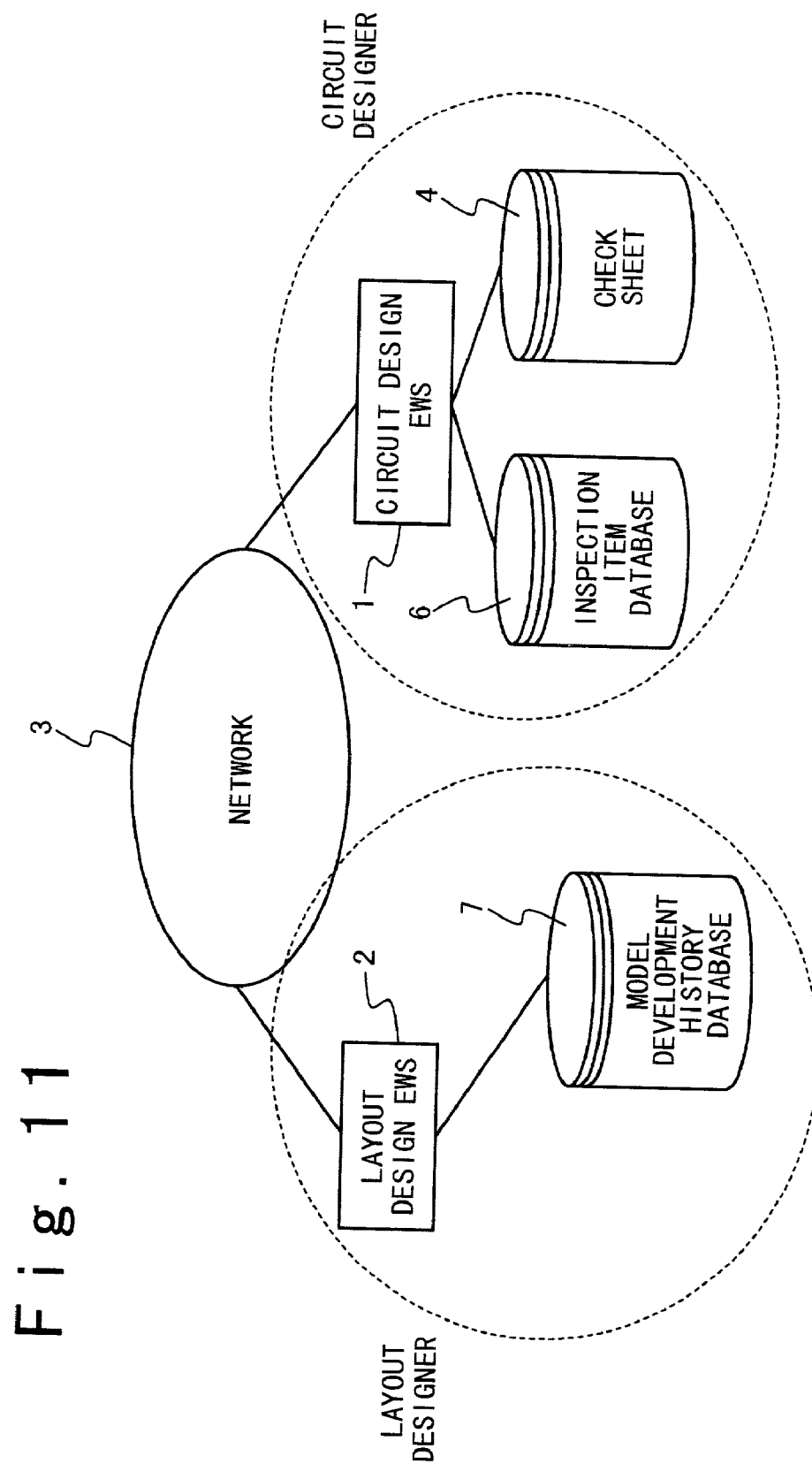
FIG. 11 is a block diagram showing a configuration of a semiconductor design system according to another embodiment of the present invention.

FIG. 11 shows another embodiment of the semiconductor designing system according to the present invention. A circuit design EWS1 has a check sheet 4 and an inspection item database 6. A layout design EWS2 has a model development history database 7. At this time, the check sheet 4 is different from the previous embodiment. A circuit feature and an inspection result are written thereto, or only an inspection item to be executed and its inspection result are written thereto.

Figure 12:
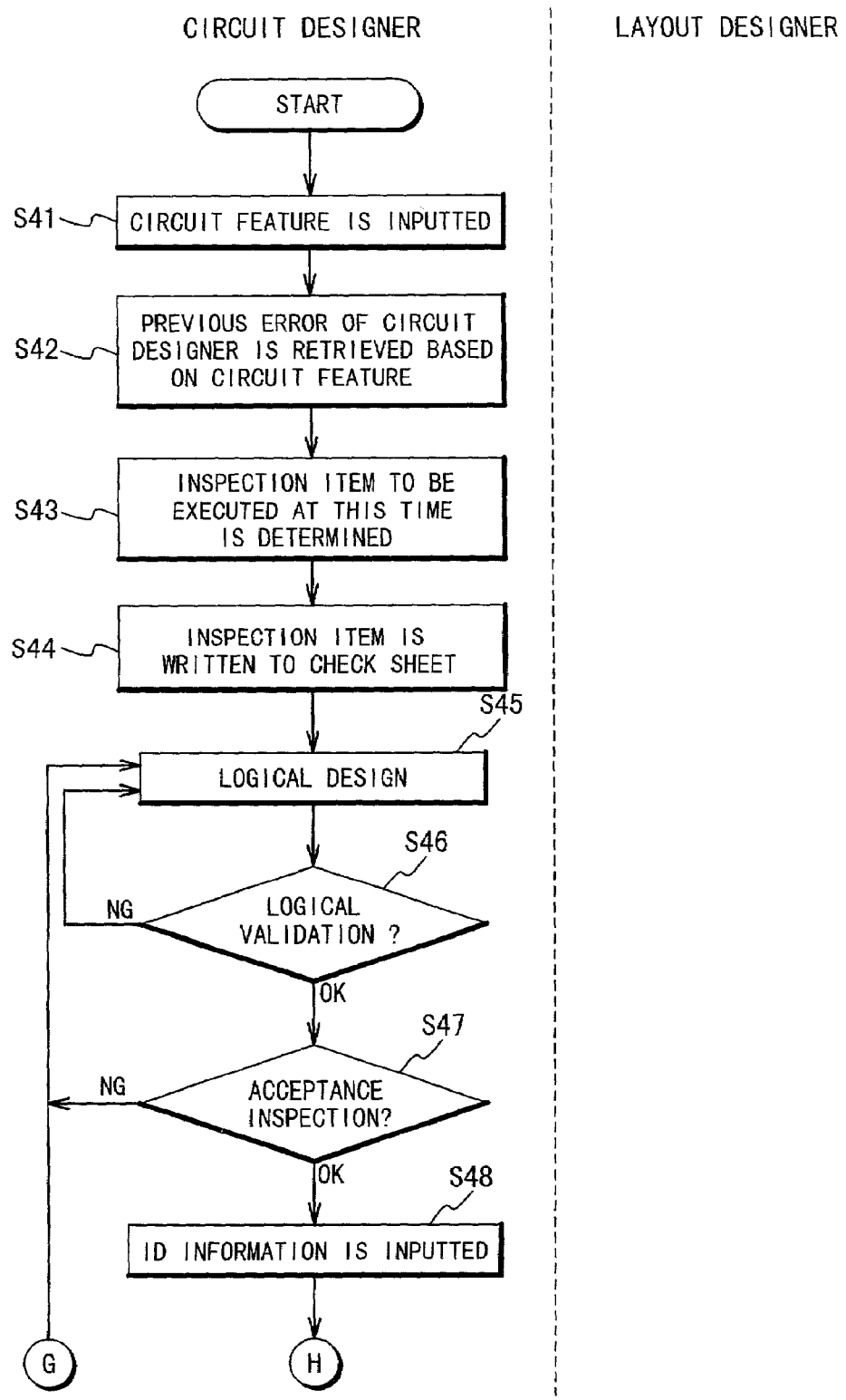
FIG. 12 is a flow chart of semiconductor design method according to yet still another embodiment of the present invention.
Figure 13:
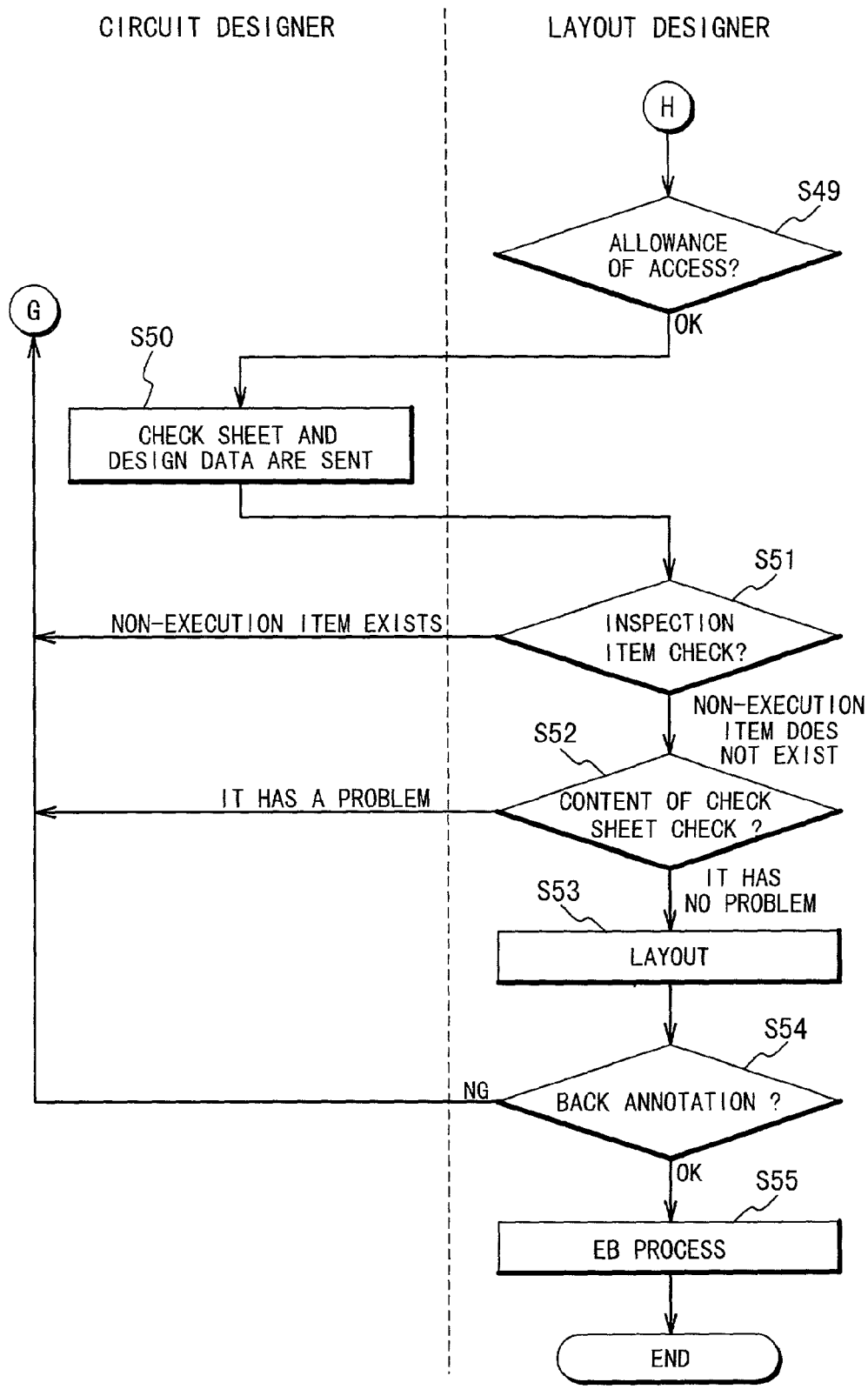
FIG. 13 is a flow chart of semiconductor design method according to yet still another embodiment of the present invention.

FIGS. 12, 13 show the operation of the semiconductor designing system according to another embodiment of the present invention. At first, the circuit designer inputs to the circuit design EWS1 the circuit feature of the semiconductor integrated circuit to be designed (Step S41). The circuit design EWS1 retrieves an error when previously designing the semiconductor integrated circuit, on the basis of the model development history database 7 (Step S42). The circuit design EWS1 determines an inspection item to be executed at this time, in accordance with the retrieved inspection item (Step S43).

The circuit design EWS1 writes to the check sheet 4 the circuit feature of the semiconductor integrated circuit and the inspection item to be executed (Step S44), and displays the previous error content on the screen. The circuit designer designs the logical circuit while paying attention to the previous error content (Step S45). If the design of the logical circuit is completed, a logical validation of the logical circuit is carried out (Step S46). If any trouble is discovered in the logical validation, the logical design is again carried out.

After the completion of the logical design, the circuit design EWS1 checks the acceptance inspection item noted in the check sheet 4 (Step S47). The inspection result is additionally written to the check sheet 4. If there is a rejected item among the inspection items noted in the check sheet 4, the logical design is again carried out. If there is no problem in all the items among the acceptance inspection items, the circuit designer inputs a circuit designer ID to the circuit design EWS1 (Step S48). The circuit design EWS1 sends the input circuit designer ID through the network 3 to the layout design EWS2.

The layout design EWS2 judges an allowance or rejection of an access in accordance with the circuit designer ID (Step S49). If it is judged that there is no problem in the circuit designer ID, the access is allowed, and the layout EWS2 reports its fact to the circuit design EWS1. In the circuit designer, if the access is allowed, the circuit design EWS1 sends to the circuit design EWS2 the check sheet 4 together with the design data, such as the circuit connection information, the pattern and the like (Step S50).

The layout design EWS2 compares the execution inspection items noted in the check sheet 4 with the executed result, in response to the reception of the check sheet 4 (Step S51). If there is an inspection item in which the executed result is not noted in the inspection items to be executed, it is judged as a non-execution, and it is returned back to the circuit designer, and the inspection of the non-execution item is requested. If there is a result unsuitable for the layout as the result of the acceptance inspection, it is returned back to the circuit designer, and the improvement based on the re-design is requested (Step S52). If the layout has no problem in all the inspection items, the inspection result together with the circuit feature and the circuit designer ID is written to the model development history database 7.

After that, the layout designer designs the layout (Step S53). After the design of the layout, the back annotation is carried out (Step S54). In the back annotation, it is confirmed whether or not the semiconductor integrated circuit carries out a desirably functional operation at a delay after the layout, and additionally writes its result to the model development history database 7. If the result of the back annotation is NG, it is returned back to the circuit designer, and the improvement based on the re-design is requested. If the result of the back annotation is OK, the EB process is carried out (Step S55).

Such a semiconductor circuit designing system can clarify the inspection item to be executed without any intervention of the network 3 by the circuit design EWS1. In the logical design in which the previous error is not displayed and the inspection item is not exempted, a communication between the circuit design EWS1 and the layout design EWS2 is small and efficient. By the way, the inspection item database may be simultaneously installed in both the circuit design EWS1 and the layout design EWS2. In this case, the semiconductor circuit designing system is operated as shown in FIGS. 12, 13, similarly to this embodiment.

Figure 14:
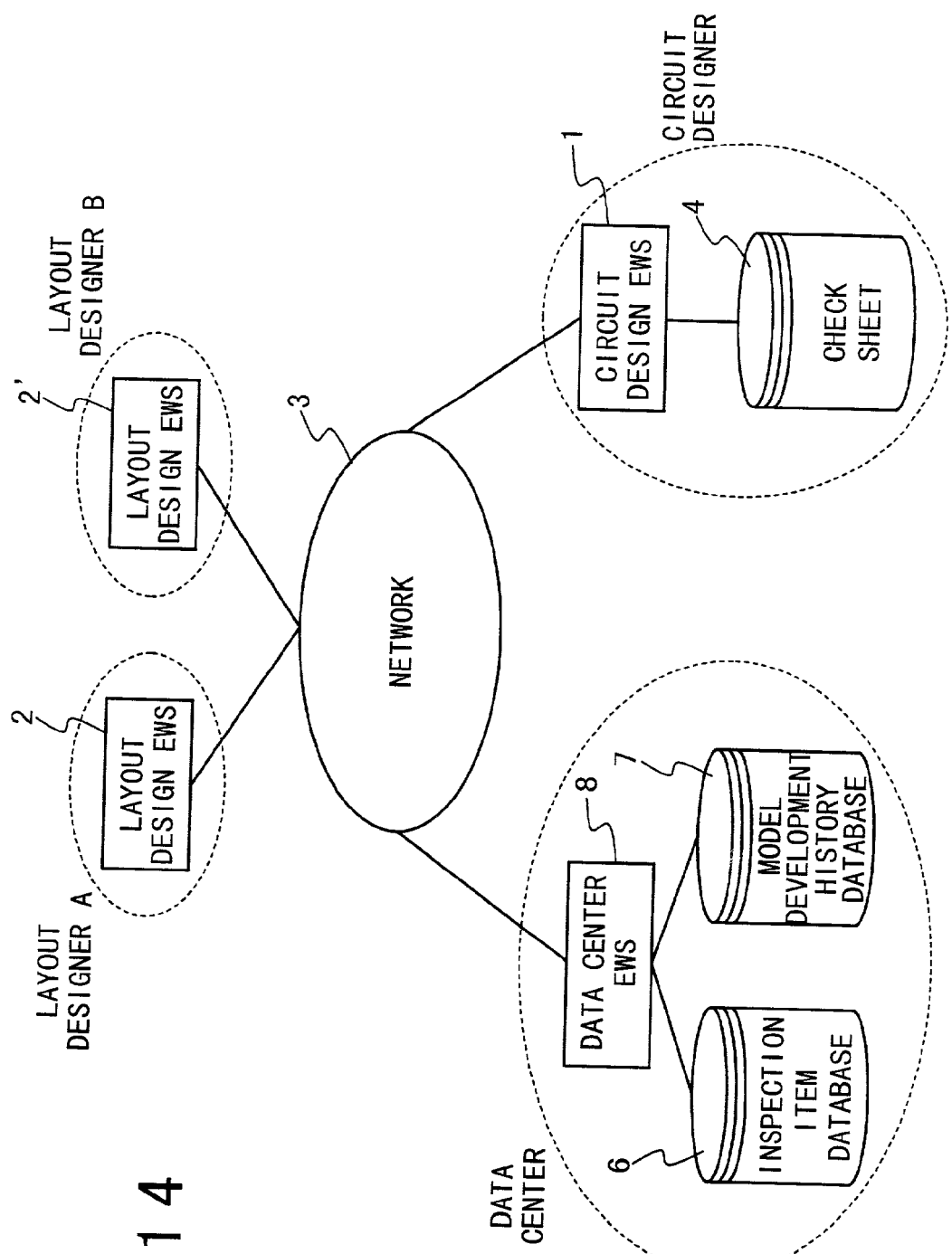
FIG. 14 is a block diagram showing a configuration of a semiconductor design system according to still another embodiment of the present invention.

Another embodiment of the semiconductor designing system according to the present invention has a plurality of layout designs EWS. As shown in FIG. 14, a layout design EWS2 belongs to a layout designer A, and a layout design EWS2' belongs to a layout designer B. The semiconductor designing system according to another embodiment of the present invention further includes a data center 8. The data center 8 is connected to the network 3, and it has a inspection item database 6 and a model development history database 7.

The circuit EWS1 obtains the data of the inspection item database 6 through the network 3 from the data center 8. The layout EWS2 obtains the data of the inspection item database 6 or the model development history database 7 through the network 3 from the data center 8. The layout EWS2 further updates the data of the model development history database 7 through the network 3.

If each of the plurality of layouts EWS has the inspection item database 6 and the model development history database 7, the database is managed by each layout EWS2, and the database is updated by each layout EWS2. In the semiconductor designing system according to another embodiment of the present invention, the inspection item database 6 or the model development history database 7 is unitarily managed. It is easy to update the inspection item database 6 or the model development history database 7.

By the way, a layout EWS2 that is a part of the plurality of layouts EWS2 may also hold the function of the data center without separately installing the data center 8.

The semiconductor circuit designing apparatus and the semiconductor circuit designing method according to the present invention can avoid the occurrence of the problem in the later step in advance by providing the inspection items in the acceptance inspection to the circuit designer.

The present application claims priority under 35 U.S.C. § 119 to Japanese Patent Application No. 2000-354306, filed at day of Nov. 21, 2000, entitled "A semiconductor circuit designing apparatus and a semiconductor circuit designing method". The contents of that application are incorporated herein by reference in their entirety.

What is claimed is:

1. A semiconductor circuit designing apparatus, comprising:
   a circuit design unit which executes a logical design of a semiconductor integrated circuit; and
   an inspection item database section in which a circuit feature of said semiconductor integrated circuit corresponds to at least one inspection item of an inspection to be executed before a layout design of said semiconductor integrated circuit is executed,
   wherein said circuit design unit generates circuit feature information indicating said circuit feature for said semiconductor integrated circuit for which said logical design should be executed,
   wherein said circuit design unit obtains a certain inspection item of said at least one inspection item corresponding to said target circuit feature information from said inspection item database section, and
   wherein said circuit design unit executes said logical design of said semiconductor integrated circuit in reference to said certain inspection item, and further comprising:
   a model development history database section in which ID data of said circuit design unit is stored corresponding to a number of times said circuit design unit failed said inspection of each one of said at least one inspection item previously,
   wherein said certain inspection item is determined such that an inspection item of said at least one inspection item for which said number of times is smaller than a predetermined value is withdrawn from said at least one inspection item.

2. The semiconductor circuit designing apparatus according to claim 1, further comprising:
   a layout design unit executing said layout design,
   wherein said circuit design unit executes said inspection of said target semiconductor integrated circuit for which said layout design is executed, with regard to said certain inspection item, and
   wherein said circuit design unit provides a result of said inspection of said semiconductor integrated circuit to said layout design unit.

3. The semiconductor circuit designing apparatus according to claim 2, wherein when said provided result of said inspection does not indicate a defect, said layout design unit stores said ID data of said circuit design unit and said number of times said circuit design unit failed said inspection of said certain inspection item in said model development history database section.

4. The semiconductor circuit designing apparatus according to claim 3, wherein said inspection item database section is connected to said layout design unit.

5. The semiconductor circuit designing apparatus according to claim 2, wherein said inspection item database section is connected to said layout design unit.

6. The semiconductor circuit designing apparatus according to claim 1, wherein said inspection item database section is connected to said circuit design unit.

7. A semiconductor circuit designing method, comprising:
   (a) providing an inspection item database section in which a circuit feature of a semiconductor integrated circuit for which a logical design should be executed corresponds to an inspection item of an inspection to be executed before a layout design of said semiconductor integrated circuit is executed;
   (b) notifying a circuit designer executing said logical design of said semiconductor integrated circuit of said inspection item, retrieved from said inspection item database section;
   (c) executing said logical design of said semiconductor integrated circuit by said circuit designer with reference to said inspection item; and
   (d) executing said layout design of said semiconductor integrated circuit by a layout designer with respect to said inspection item.

8. A semiconductor circuit designing method, comprising:
   (a) providing a circuit design unit executing a logical design of a semiconductor integrated circuit; and
   (b) providing an inspection item database section in which a circuit feature of said semiconductor integrated circuit corresponds to at least one inspection item of an inspection to be executed before a layout design of said semiconductor integrated circuit is executed,
   wherein said circuit design unit generates circuit feature information indicating said circuit feature of said semiconductor integrated circuit for which said logical design should be executed,
   wherein said circuit design unit obtains a certain inspection item of said at least one inspection item, said certain inspection item corresponding to said circuit feature information from said inspection item database section, and
   wherein said circuit design unit executes said logical design of said semiconductor integrated circuit with reference to said certain inspection item, and further comprising:
   (c) providing a model development history database section in which ID data of said circuit design unit corresponds to a number of times said circuit design unit failed said inspection of each one of said at least one inspection item previously,
   wherein said certain inspection item is determined such that an inspection item of said at least one inspection item for which said number of times is smaller than a predetermined value is withdrawn from said at least one inspection item.

9. The semiconductor circuit designing method according to claim 8, further comprising:
   (d) providing a layout design unit executing said layout design,
   wherein said circuit design unit executes said inspection of said semiconductor integrated circuit for which said layout design is executed, with regard to said certain inspection item, and
   wherein said circuit design unit provides a result of said inspection of said semiconductor integrated circuit to said layout design unit.

10. The semiconductor circuit designing method according to claim 9, wherein when said provided result of said inspection does not indicate a defect, said layout design unit stores said ID data of said circuit design unit and said number of times said circuit design unit failed said inspection of said certain inspection item in said model development history database section.

* * * * *